(12) United States Patent  
Park et al.

(10) Patent No.: US 10,566,419 B2  
(45) Date of Patent: Feb. 18, 2020

(54) SEMICONDUCTOR DEVICE AND MANUFACTURING METHOD THEREOF

(71) Applicant: SK hynix Inc., Icheon-si Gyeonggi-do (KR)

(72) Inventors: Hae Chan Park, Cheongju-si (KR); Jae Taek Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/210,737

(22) Filed: Dec. 5, 2018

(65) Prior Publication Data

US 2019/0115425 A1 Apr. 18, 2019

Related U.S. Application Data

(63) Continuation of application No. 15/918,348, filed on Mar. 12, 2018, now Pat. No. 10,177,224.

(30) Foreign Application Priority Data

Aug. 1, 2017 (KR) .......................... 10-2017-0097824

(51) Int. Cl.  
*H01L 29/06* (2006.01)  
*H01L 23/528* (2006.01)  
(Continued)

(52) U.S. Cl.  
CPC ........ *H01L 29/0649* (2013.01); *H01L 23/528* (2013.01); *H01L 27/11582* (2013.01);  
(Continued)

(58) Field of Classification Search  
CPC ........... H01L 29/0649; H01L 29/40117; H01L 27/11582; H01L 27/249; H01L 27/11556;  
(Continued)

(56) References Cited

U.S. PATENT DOCUMENTS

2013/0328005 A1* 12/2013 Shin .................... H01L 27/2436  
257/1  
2015/0303209 A1 10/2015 Park et al.  
(Continued)

FOREIGN PATENT DOCUMENTS

KR 1020160069903 A 6/2016

*Primary Examiner* — Yosef Gebreyesus  
(74) *Attorney, Agent, or Firm* — William Park & Associates Ltd.

(57) ABSTRACT

A semiconductor device includes a stack structure located on a substrate and includes a first region, in which sacrificial layers and insulating layers are alternately stacked, and a second region, in which conductive layers and insulating layers are alternately stacked. The stack structure also includes a first slit insulating layer located at a boundary between the first region and the second region, wherein the first slit insulating layer penetrates the stack structure and extends in one direction. The stack structure further includes a plurality of slit insulating patterns located in the second region, wherein the plurality of slit insulating patterns penetrate the stack structure and are arranged along the one direction. At least one conductive layer among the conductive layers is bent between the first slit insulating layer and the slit insulating patterns.

20 Claims, 14 Drawing Sheets

(51) Int. Cl.
  *H01L 27/11582* (2017.01)
  *H01L 27/24* (2006.01)
  *H01L 45/00* (2006.01)
  *H01L 27/11556* (2017.01)
  *H01L 27/11565* (2017.01)
  *H01L 21/28* (2006.01)

(52) U.S. Cl.
  CPC ............ *H01L 27/249* (2013.01); *H01L 45/04* (2013.01); *H01L 45/06* (2013.01); *H01L 45/10* (2013.01); *H01L 45/1233* (2013.01); *H01L 27/11556* (2013.01); *H01L 27/11565* (2013.01); *H01L 27/2481* (2013.01); *H01L 29/40117* (2019.08)

(58) Field of Classification Search
  CPC ........... H01L 27/11565; H01L 27/2481; H01L 45/04; H01L 45/06; H01L 45/10; H01L 45/1233
  See application file for complete search history.

(56) References Cited

U.S. PATENT DOCUMENTS

2016/0064279 A1   3/2016   Hyun
2016/0079069 A1   3/2016   Uenaka et al.

\* cited by examiner

SEMICONDUCTOR DEVICE AND MANUFACTURING METHOD THEREOF

CROSS-REFERENCE TO RELATED APPLICATION

The present application is a continuation application for U.S. patent application Ser. No. 15/918,348, filed on Mar. 12, 2018, and claims priority under 35 U.S.C. § 119(a) to Korean patent application number 10-2017-0097824 filed on Aug. 1, 2017, in the Korean Intellectual Property Office, the entire disclosure of which is incorporated herein by reference.

BACKGROUND

1. Technical Field

An aspect of the present disclosure relates to an electronic device, and more particularly, to a semiconductor device and a manufacturing method thereof.

2. Related Art

Nonvolatile memory devices are memory devices that retain stored data even when a power supply for the memory devices is cut off. As the improvement of the degree of integration of two-dimensional nonvolatile memory devices in which memory cells are formed in a single layer on a substrate reaches its limit, there has recently been proposed three-dimensional nonvolatile memory devices in which memory cells are vertically stacked on substrates.

The three-dimensional nonvolatile memory devices include interlayer insulating layers and gate electrodes, which are alternately stacked, and channel layers penetrating the interlayer insulating layers and the gate electrodes. Memory cells are stacked along the channel layers. Various structures and manufacturing methods have been developed so as to improve the operational reliability of the three-dimensional non-volatile memory devices. However, with this new technology still in its infancy, many improvements remain to be made.

SUMMARY

Embodiments herein are directed to improved characteristics and a manufacturing method of stable three-dimensional (3-D) semiconductor devices having stacked structures. In some instances, the semiconductor devices include a plurality of stacked memory cells.

According to an aspect of the present disclosure, there is provided a semiconductor device including. a stack structure located on a substrate, the stack structure having a first region, in which sacrificial layers and insulating layers are alternately stacked, and a second region, in which conductive layers and insulating layers are alternately stacked. The semiconductor device further includes a first slit insulating layer located at a boundary between the first region and the second region, the first slit insulating layer penetrating the stack structure and extending in one direction. The semiconductor device also includes a plurality of slit insulating patterns located in the second region, the plurality of slit insulating patterns penetrating the stack structure and arranged along the one direction, wherein at least one conductive layer among the conductive layers is bent between the first slit insulating layer and the slit insulating patterns.

According to an aspect of the present disclosure, there is provided a semiconductor device including, a first stack structure, having sacrificial layers and insulating layers, which are alternately stacked, and a second stack structure having conductive layers and insulating layers, which are alternately stacked. The semiconductor device additionally includes a first slit insulating layer located between the first stack structure and the second stack structure, with the first slit insulating layer and extending in one direction. The semiconductor device also has a plurality of slit insulating patterns penetrating the second stack structure, the plurality of slit insulating patterns being arranged along the one direction, wherein the slit insulating patterns have a height lower than that of the first slit insulating layer.

According to an aspect of the present disclosure, there is provided a method of manufacturing a semiconductor device, the method including. forming a stack structure that includes sacrificial layers and insulating layers, which are alternately stacked on a substrate, and forming a first slit insulating layer penetrating the stack structure and extending in one direction. The method further includes forming a plurality of slit insulating patterns penetrating the stack structure and arranged along the one direction, and forming a second slit penetrating the stack structure and extending in the one direction, wherein the slit insulating patterns are located between the first slit insulating layer and the second slit. The method also includes replacing the sacrificial layers located between the first slit insulating layer and the slit insulating patterns and between the slit insulating patterns and the second slit with conductive layers through the second slit, wherein at least one conductive layer among the conductive layers is bent between the first slit insulating layer and the slit insulating patterns.

According to an aspect of the present disclosure, there is provided a method of manufacturing a semiconductor device, the method including. forming a stack structure that includes sacrificial layers and insulating layers, which are alternately stacked, and forming a first slit insulating layer penetrating the stack structure and extending in one direction. The method additionally includes forming a plurality of slit insulating patterns penetrating the stack structure and arranged along the one direction, and also forming a second slit penetrating the stack structure and extending in the one direction, wherein the slit insulating patterns are located between the first slit insulating layer and the second slit. The method further includes forming openings by removing the sacrificial layers through the second slit such that sacrificial layers located on one side of the first slit insulating layer remain and sacrificial layers located on the other side of the first slit insulating layer are removed. The method also includes performing a heat treatment process, wherein the first slit insulating layer and the slit insulating patterns are shrunk with different heights, and forming conductive layers in the openings.

BRIEF DESCRIPTION OF THE DRAWINGS

Embodiments are described in detail below with reference to the accompanying drawings. Provided embodiments should not be construed as being limited to the descriptions and drawings as set forth herein. Those of ordinary skill in the art will appreciate that various modifications and changes can be made without departing from the scope of the teachings as set forth in the claims below. Accordingly, the specification and drawings are to be regarded in an illustrative rather than a restrictive sense, and all such modifications are intended to be included within the scope of present teachings.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
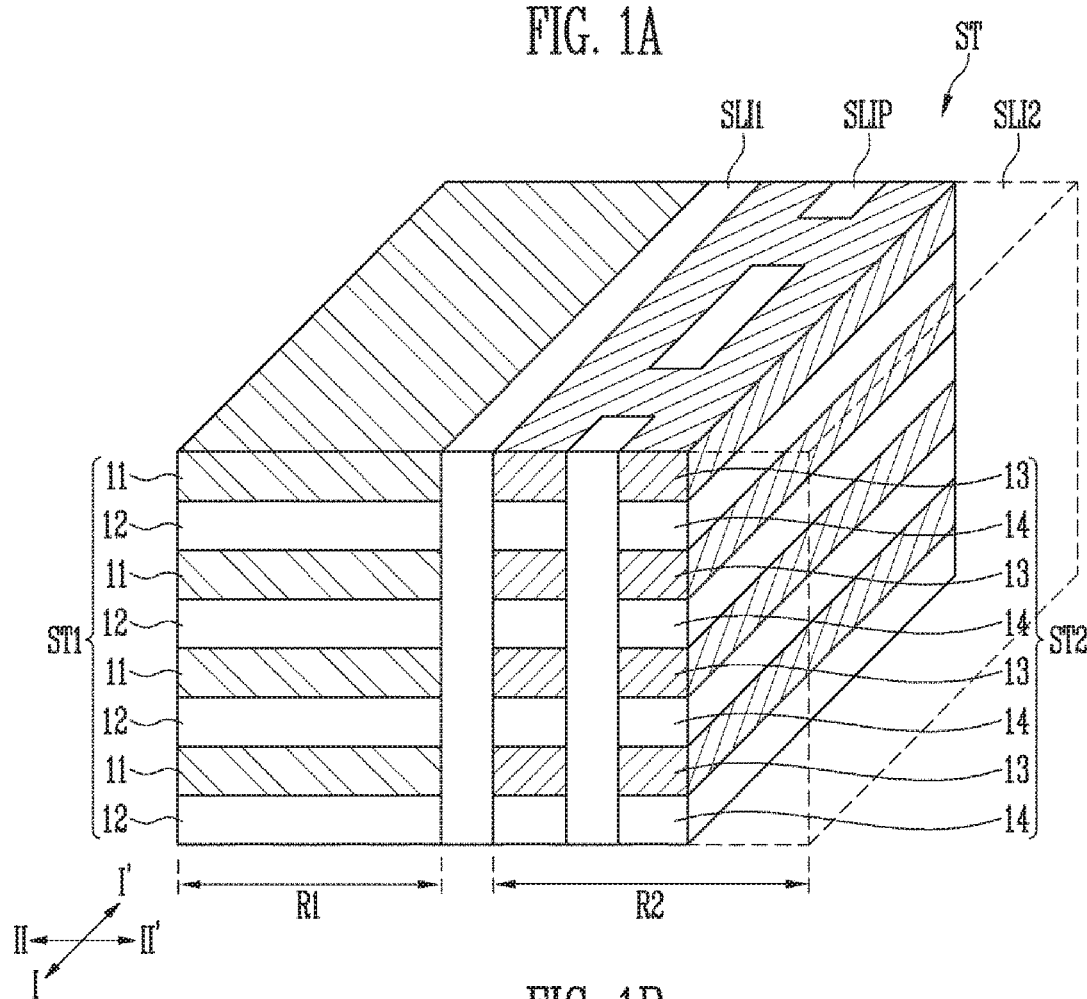
FIGS. 1A to 1C show views illustrating a structure of a semiconductor device according to an embodiment of the present disclosure.

Example embodiments of the present disclosure are described with reference to the accompanying drawings. Embodiments of the present disclosure, however, can take many different forms and should not be construed as being limited to the specific embodiments set forth herein. The example embodiments are provided to facilitate a thorough and complete understanding of the teachings herein as set forth by the included claims. The features of example embodiments of presented herein may be employed in various and numerous forms without departing from the scope of the present teachings. In the drawings, the relative sizes of components and the spacing between components may be exaggerated for clarity. Therefore, the included figures are not necessarily drawn to scale. Like reference numerals in the drawings refer to like elements throughout the various views presented by the drawings.

In the specification, when an element is referred to as being "connected" or "coupled" to another element, the elements can be directly connected or coupled to one another, or the elements can be indirectly connected or coupled to one another with one or more intervening elements interposed therebetween. An element referred to as "including" a component, unless specifically stated otherwise, indicates that the element may further include one or more other components in addition to any explicitly stated components of the element.

Figure 1B:
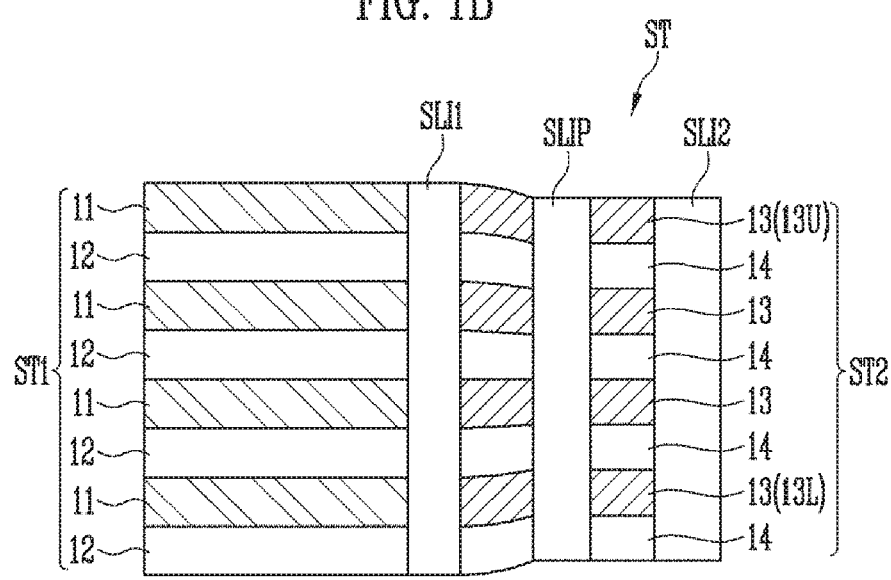
Figure 1C:
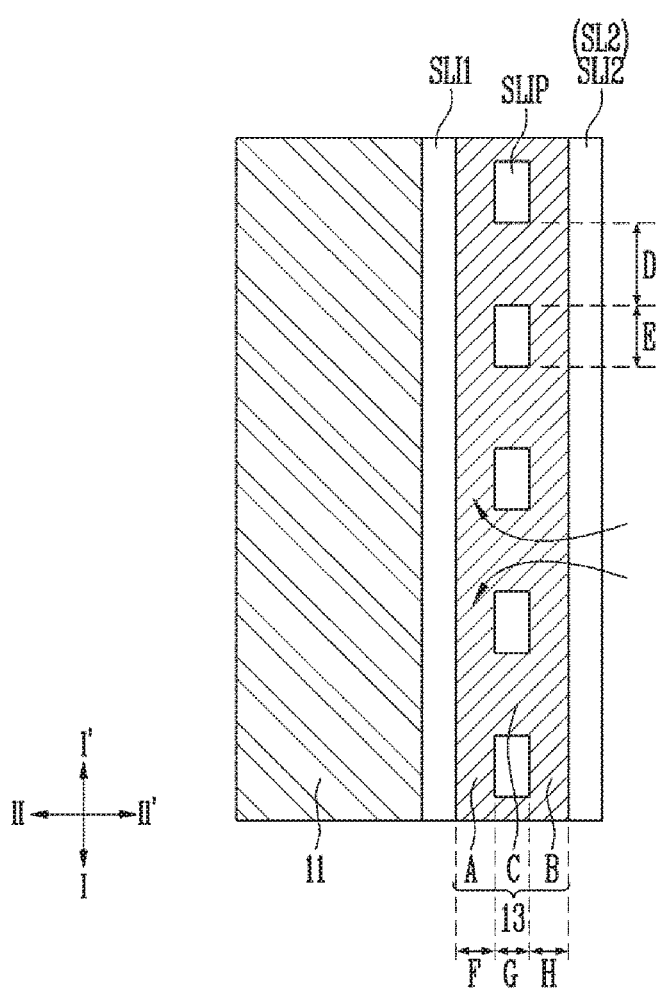

FIGS. 1A to 1C show views illustrating a structure of a semiconductor device in accordance with an embodiment of the present disclosure. Specifically, FIG. 1A shows a perspective view, FIG. 1B shows a sectional view, and FIG. 1C shows a layout view.

Referring to FIG. 1A, the semiconductor device includes a stack structure ST, a first slit insulating layer SLI1, and slit insulating patterns SLIP. Also, the semiconductor device may further include a second slit insulating layer SLI2.

The stack structure ST may be located on a substrate (not shown) and may include a first region R1 and a second region R2. The first region R1 of the stack structure ST may include sacrificial layers 11 and insulating layers 12, which are alternately stacked. The second region R2 of the stack structure ST may include conductive layers 13 and insulating layers 14, which are alternately stacked. In other words, the stack structure ST may include a first stack structure ST1, in which the sacrificial layers 11 and the insulating layers 12 are alternately stacked, and a second stack structure ST2, in which the conductive layers 13 and the insulating layers 14 are alternately stacked.

Here, the sacrificial layers 11 may be layers having a high etching selection ratio with respect to the insulating layers 12. For example, the sacrificial layers 11 may be dielectric layers. The sacrificial layers 11 may be nitride layers, and the insulating layers 12 may be oxide layers. The conductive layers 13 may be word lines, selection lines, conductive pads, etc., and may include a metal such as tungsten.

The first slit insulating layer SLI1 extends in a first direction I-I' and penetrates the stack structure ST. The first slit insulating layer SLI1 may be located at a boundary between the first region R1 and the second region R2, and may isolate the first region R1 and the second region R2 spatially and electrically from each other. In other words, the first slit insulating layer SLI1 may be located between the first stack structure ST1 and the second stack structure ST2, and it may isolate the first stack structure ST1 and the second stack structure ST2 spatially and electrically from each other. Alternatively, the first slit insulating layer SLI1 may be located at the boundary between the first region R1 and the second region R2, and may isolate the sacrificial layers 11 and the conductive layers 13 from each other.

The slit insulating patterns SLIP may be located in the second region R2 of the stack structure ST, penetrate the stack structure ST, and be arranged along the first direction I-I'. As illustrated, the plurality of slit insulating patterns SLIP are arranged such that their centers align in the I-I' direction. In other embodiments, a plurality of slit insulating patterns SLIP may be offset in a second direction II-II' to have a staggered arrangement. The second direction II-II' intersect the first direction I-I'. The slit insulating patterns SLIP may be located adjacent and/or parallel to the first slit insulating layer SLI1.

The second slit insulating layer SLI2 is located in the second region R2 of the stack structure ST, penetrates the stack structure ST, and extends in the first direction I-I'. The second slit insulating layer SLI2 may extend parallel to the first slit insulating layer SlI1, and the slit insulating patterns SLIP may be located between the first slit insulating layer SLI1 and the second slit insulating layer SLI2. For example, the first slit insulating layer SLI1, the slit insulating patterns SLIP, and the second slit insulating layer SLI2 may all be adjacent to each other in the second direction II-II' and/or parallel to each other.

Referring to FIG. 1B, one or more conductive layers 13L and 13U among the conductive layers 13 may be partially bent. For example, one or more uppermost conductive layers 13U and one or more lowermost conductive layers 13L may be partially bent. That is, some conductive layers 13L and 13U among the conductive layers 13 may have a structure in which they are partially bent, and the other conductive layers 13 may have a plate structure in which they are flat.

The one or more conductive layers 13U and 13L may be bent between the first slit insulating layer SLI1 and the slit insulating patterns SLIP. In other words, the one or more conductive layers 13U and 13L are parallel to the substrate between the second slit insulating layer SLI2 and the slit insulating patterns SLIP, and are bent at a predetermined angle with respect to the substrate between the first slit insulating layer SL1 and the slit insulating patterns SLIP. For example, a first conductive layer 13L among the conductive layers 13 may be bent upward between the first slit insulating layer SLI1 and the slit insulating patterns SLIP, and a second conductive layer 13U located at a level higher than that of the first conductive layer 13L may be bent downward between the first slit insulating layer SLI1 and the slit insulating patterns SLIP.

The partial bending of the one or more conductive layers 13L and 13U may be caused due to a difference in height between the first slit insulating layer SLI1 and the slit insulating patterns SLI1. For example, the slit insulating patterns SLIP may have a height lower than that of the first slit insulating layer SLI1 due to a difference in shrinkage rate between insulating layers, caused by a difference between ambient environments in a manufacturing process. For some embodiments, shrinking of the first slit insulating layer SLI1 and/or the slit insulating patterns SLIP is caused by a heat treatment process occurring during the manufacturing process. Therefore, the partial bending of the one or more conductive layers 13L and 13U may be caused due to asymmetrical shrinkage of the first slit insulating layer SLI1, a difference in shrinkage rates between the first slit insulating layer SLI1 and the slit insulating patterns SLIP, or a combination of the two factors.

In addition, the slit insulating patterns SLIP may have substantially the same height as the second slit insulating layer SLI2. For example, the slit insulating patterns SLIP and the second slit insulating layer SLI2 may have ambient environments similar to each other during the manufacturing process, and may therefore have shrinkage rates similar to each other. As a result, the conductive layers 13 are not bent but may maintain a flat state between the slit insulating patterns SLIP and the second slit insulating layer SLI2.

Referring to FIG. 1C, the sacrificial layers 11 are located at one side of the first slit insulating layer SLI1, and the conductive layers 13 are located at the other side of the first slit insulating layer SLI1. In addition, each of the sacrificial layers 11 and each of the conductive layers 13 are located at the same level. Thus, the sacrificial layer 11 and the conductive layer 13, which are located at the same level, are isolated from each other by the first slit insulating layer SLI1.

Each of the conductive layers 13 includes a first part A located between the first slit insulating layer SLI1 and the slit insulating patterns SLIP, a second part B located between the slit insulating patterns SLIP and the second slit insulating layer SLI2, and a third part C located between the slit insulating patterns SLIP in the first direction I-I'. Here, the first part A is a line-shaped pattern extending in the first direction I-I', the second part B is a line-shaped pattern extending in the first direction I-I', and the third part C is an island-shaped pattern that couples the first part A and the second part B to each other. Therefore, each of the conductive layers 13 may have a ladder shape. In addition, when the conductive layers 13 are word lines or selection lines, the second part B may be used as a main path through which current substantially flows, i.e., a main path through which a bias is substantially transmitted.

According to an embodiment, the conductive layer 13 may be formed by removing a sacrificial layer as an etchant is introduced into a second slit SL2 and then filling a conductive material in the region in which the sacrificial layer is removed. In addition, a space between the first slit insulating layer SLI1 and the slit insulating patterns SLIP, a space between the slit insulating patterns SLIP, and a space between the slit insulating patterns SLIP and the second slit SL2 are used as a path through which the sacrificial layer is replaced with the conductive layers 13 in the manufacturing process (see arrows). Therefore, the path having a sufficient width is to be ensured in that the sacrificial layer is sufficiently removed. To this end, a width of the first slit insulating layer SLI1 in the second direction II-II', a length of the slit insulating patterns SLIP in the first direction I-I', a width of the second slit SL2 in the second direction II-II', distances or heights between the layers, and the like are to be appropriately adjusted.

As an example, when the length E of the slit insulating patterns SLIP in the first direction I-I' is long, the sacrificial layer interposed between the first slit insulating layer SLI1 and the slit insulating patterns SLIP may not be completely or sufficiently removed. Accordingly, the length E of the slit insulating patterns SLIP is relatively decreased, so that the sacrificial layer interposed between the first slit insulating layer SLI1 and the slit insulating patterns SLIP is completely or sufficiently removed. For example, the slit insulating patterns SLIP are designed such that the distance D between the slit insulating patterns SLIP is equal to or larger than the length E of each of the slit insulating patterns SLIP (D≥E).

As another example, the sacrificial layer may not be completely removed as it becomes more distant from the second slit SL2. Accordingly, the distance H between the slit insulating patterns SLIP and the second slit SL2 is relatively decreased, so that the sacrificial layer located relatively distant from the second slit SL2 can also be removed. For example, the slit insulating patterns SLIP are designed such that the distance H between the slit insulating patterns SLIP and the second slit SL2 is smaller than the distance F between the first slit insulating layer SL1 and the slit insulating patterns SLIP and/or smaller than the width G of the slit insulating patterns SLIP (F>H and/or G>H).

As still another example, when the distance between the first slit insulating layer SLI1 and the slit insulating patterns SLIP is narrow, the echant is not sufficiently introduced between the first slit insulating layer SLI1 and the slit insulating patterns SLIP. Therefore, the sacrificial layer between the first slit insulating layer SLI1 and the slit insulating patterns SLIP may not be completely removed. Accordingly, the distance between the first slit insulating layer SLI1 and the slit insulating patterns SLIP is relatively increased, so that the etchant can be sufficiently introduced between the first slit insulating layer SLI1 and the slit insulating patterns SLIP. For example, the slit insulating patterns SLIP are designed such that the distance F between the first slit insulating layer SLI1 and the slit insulating patterns SLIP is larger than the width of the slit insulating patterns SLIP and/or larger than the distance H between the slit insulating patterns SLIP and the second slit S12 (F>G, F>H and/or F>G>H).

According to the structure described above, the region in which the conductive layer 13 is bent can be controlled between the first slit insulating layer SLI1 and the slit insulating patterns SLIP. Thus, it is possible to prevent bending of the second part B through which the current or bias is substantially transmitted.

Figure 2A:
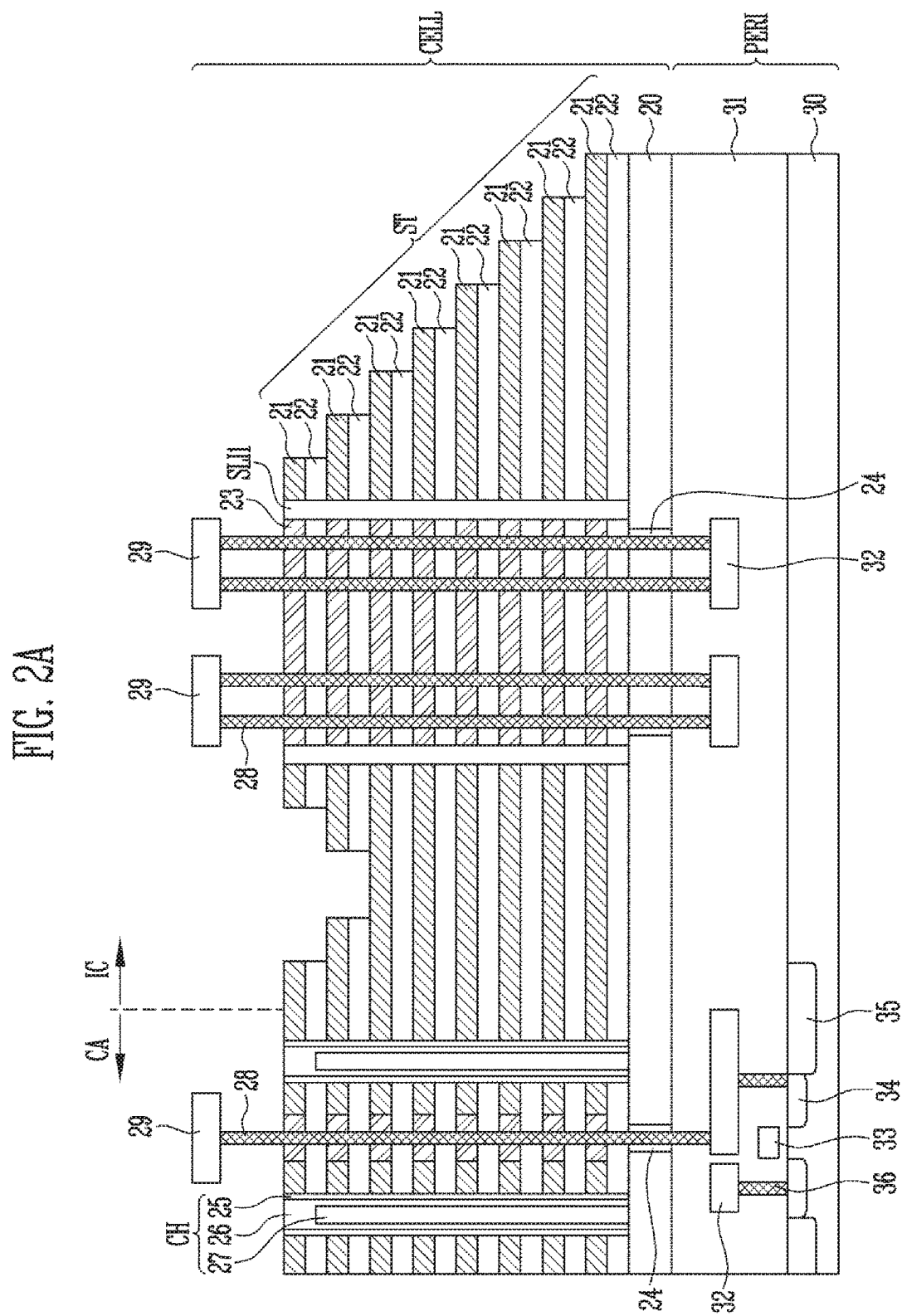
FIGS. 2A and 2B show views illustrating a structure of the semiconductor device according to an embodiment of the present disclosure.
Figure 2B:
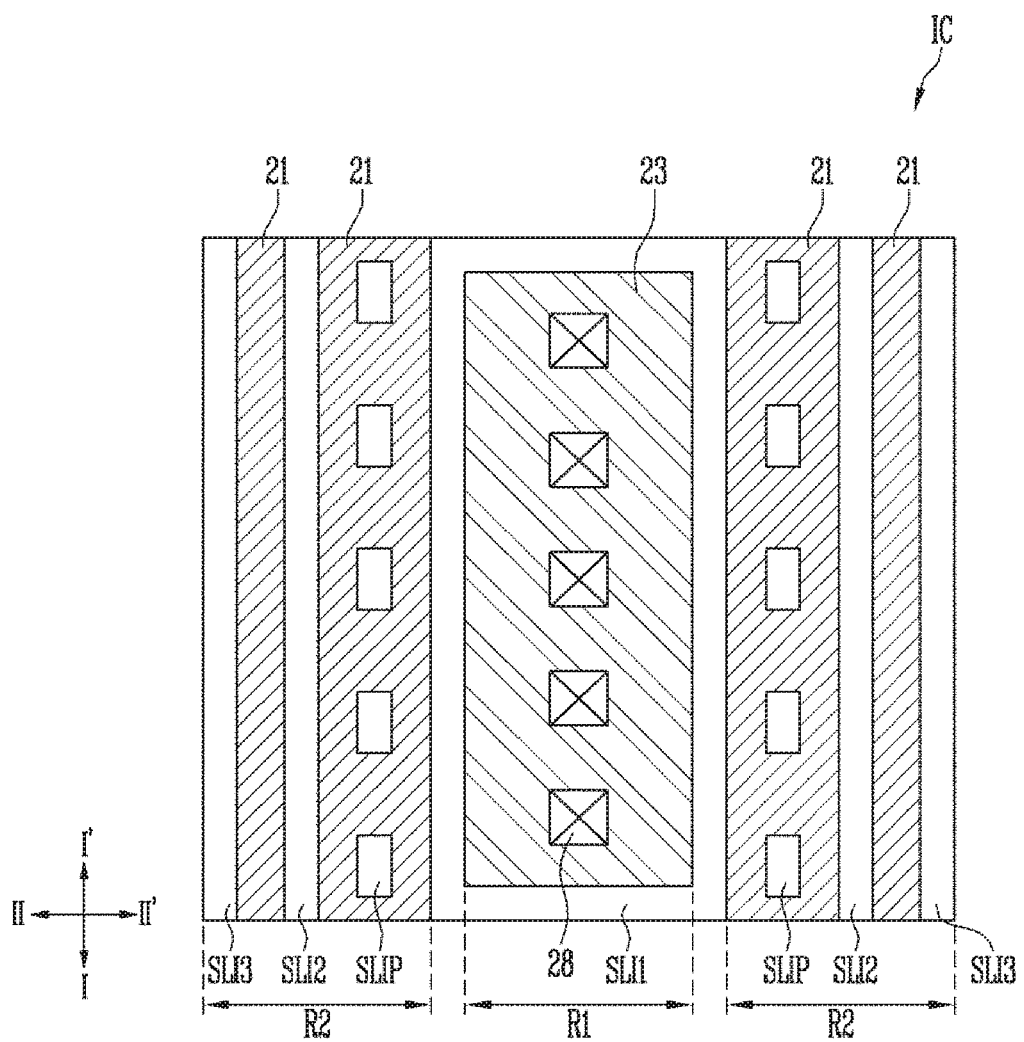

FIGS. 2A and 2B are views illustrating a structure of the semiconductor device according to an embodiment of the present disclosure. FIG. 2A is a sectional view, and FIG. 2B is a layout of an interconnection region IC of FIG. 2A. Hereinafter, descriptions of content already described above will be omitted.

Referring to FIG. 2A, the semiconductor device according to an embodiment of the present disclosure may have a structure in which a peripheral circuit region PERI is located under a cell region CELL. Here, the cell region CELL may include: a stack structure ST, located on a first substrate 20; a channel structure CH, first lines 29, a first slit insulating layer SLI1, and interconnectors 28.

The stack structure ST includes conductive layers 21 and insulating layers 22, which are alternately stacked. Also, the stack structure ST may include sacrificial layers 23 that remain in a partial region of the stack structure ST. Therefore, the stack structure ST includes the sacrificial layers 23 and the insulating layers 22, which are alternately stacked in one partial region of stack structure ST, and includes the conductive layers 21 and the insulating layers 22, which are alternately stacked in another partial region of stack structure ST. In addition, a slit insulating layer 24 may be interposed between the sacrificial layers 23 and the conductive layers 21.

As an example, at least one uppermost conductive layer 21 may be a drain select line, at least one lowermost conductive layer 21 may be a source select line, and the other conductive layers 21 may be word lines. According to such a structure, at least one source select transistor, a plurality of memory cells, and at least one drain select transistor are connected in series to constitute one memory string. In addition, the first substrate 20 may include a source layer or a source region.

As another example, at least one uppermost conductive layer 21 may be a selection line, the other conductive layers 21 may be word lines, and the first substrate 20 may be a pipe gate. According to such a structure, at least one source select transistor, a plurality of source-side memory cells, at least one pipe transistor, a plurality of drain-side memory cells, and at least one drain select transistor are connected in series to constitute one memory string.

The stack structure ST may include a cell array region CA and an interconnection region IC. Memory strings including stacked memory cells may be located in the cell array region CA. The interconnection region IC is a region for applying a bias to each of the conductive layers 21. The interconnection region IC may be patterned in the shape of steps to expose each of the conductive layers 21. For example, interconnections such as contact plugs (not shown) respectively connected to the conductive layers 21 may be located in the interconnection region IC.

The channel structures CH are located in the cell array region CA and penetrate the stack structure ST. For example, the channel structure CH penetrates a region in which the conductive layers 21 and the insulating layers 22 are alternately stacked in the stack structure ST, and the channel structure CH is connected to the source layer or source region included in the substrate 20. The channel structure CH includes a channel layer 26 and a data storage layer 25 surrounding a sidewall of the channel layer 26, and a gap-fill insulating layer 27 may be filled in the channel layer 26.

The interconnectors 28 may be located in the cell array region CA or in the interconnection region IC, and the interconnectors 28 may penetrate the stack structure ST to electrically couple an upper line 29 and a lower line 32 to each other. For example, the interconnectors 28 may be contact plugs or may be conductive layers. The interconnectors 28 penetrate a region in which the sacrificial layers 23 and the insulating layers 22 are alternately stacked in the stack structure ST. Here, since the sacrificial layers 23 are formed of a non-conductive material, the interconnectors 28 are insulated from the conductive layers 21 by the sacrificial layers 23. Also, the interconnectors 28 may penetrate the first substrate 20 located under the stack structure ST. When the first substrate 20 includes a poly-silicon layer, etc., the insulating layer 24 may be interposed between the interconnectors 28 and the first substrate 20 to prevent electrical connection between the interconnectors 28 and the first substrate 20.

The peripheral circuit region PERI may include a second substrate 30, a transistor, second lines 32, and contact plugs 36. The second substrate 30 may be a semiconductor substrate including silicon (Si), germanium (Ge), and/or other suitable semiconductors. The second lines 32 may be located between the second substrate 30 and the stack structure ST, and may be located in an insulating layer 31 between the first substrate 20 and the second substrate 30. The transistor may include a gate electrode 33 and a junction 34 in the second substrate 30, and the junction 34 and the second lines may be electrically connected by the contact plugs 36. In addition, the second substrate 30 may include a device isolation layer 35.

Referring to FIG. 2B, the interconnection region IC of the stack structure ST may include a first slit insulating layer SLI1, slit insulating patterns SLIP, and a second slit insulating layer SLI2. Additionally, the interconnection region IC of the stack structure ST may further include a third slit insulating layer SLI3. Also shown are interconnectors 28 passing through alternately stacked sacrificial layers 23 and the insulating layers 22 (visible in FIG. 2A).

Here, the first slit insulating layer SLI1 isolates a second region R2, in which the conductive layers 21 and the insulating layers 22 are alternately stacked, and a first region R1, in which the sacrificial layers 23 and the insulating layers 22 are alternately stacked, from each other. For the embodiment shown, the first slit insulating layer SLI1 has a cross section of a closed curve shape, and the first region R1 is located in the first slit insulating layer SLI1 having the closed curve shape.

The third slit insulating layer SLI3 may be located in the second region R2, penetrate the stack structure ST, and extend in a first direction I-I'. Here, the second slit insulating layer SLI2 is located between the slit insulating patterns SLIP and the third slit insulating layer SLI3. Further, the second slit insulating layer SLI2 may be located in the second region R2, penetrate the stack structure ST, and extend in the one direction. Here, the slit insulating patterns SLIP are located between the first slit insulating layer SLI1 and the second slit insulating layer SLI2. In an embodiment, at least one conductive layer 21 among multiple conductive layers 21 may be partially bent between the first slit insulating layer SLI1 and the slit insulating patterns SLIP, and may have a flat structure in the other regions. For example, at least one conductive layer 21 may be bent at a predetermined angle with respect to the first substrate 20 between the first slit insulating layer SLI1 and the slit insulating patterns SLIP, and may be parallel to the first substrate 20 between the second slit insulating layer SLI2 and the slit insulating patterns SLIP and between the third slit insulating layer SLI3 and the second slit insulating layer SLI2.

FIGS. 3A, 3B, 4A, 4B, 5A, 5B, 6A, and 6B are sectional views illustrating a manufacturing method of the semiconductor device according to an embodiment of the present disclosure. Each of FIGS. 3A, 4A, 5A, and 6A is a sectional view of the interconnection region IC, and each of FIGS. 3B, 4B, 5B, and 6B is a sectional view of the cell array region CA. Hereinafter, descriptions of content already described above will be omitted.

For reference, in each of FIGS. 3A, 4A, 5A, and 6A, sacrificial layers 41A to 41C and insulating layers 42A to 42C located at a lower portion of a stack structure ST are designated by "L," sacrificial layers 41A to 41C and insulating layers 42A to 42C located at an upper portion of the stack structure ST are designated by "U," and sacrificial layers 41A to 41C and insulating layers 42A to 42C located at a middle portion of the stack structure ST are designated by "M." Also, in each of FIGS. 3B, 4B, 5B, and 6B, only some levels of the stack structure ST are illustrated for convenience of description.

Figure 3A:
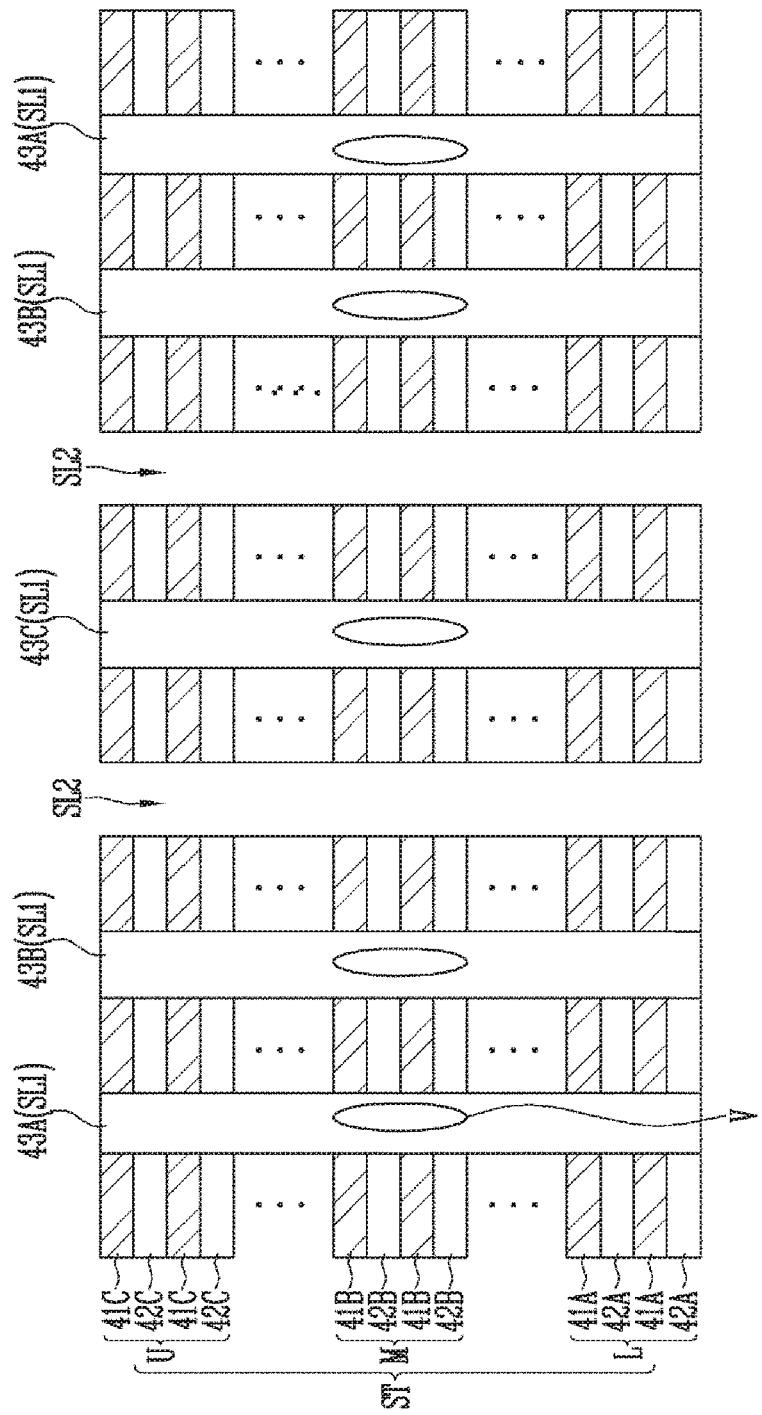
FIGS. 3A, 3B, 4A, 4B, 5A, 5B, 6A, and 6B show sectional views illustrating a manufacturing method of the semiconductor device according to an embodiment of the present disclosure.
Figure 3B:
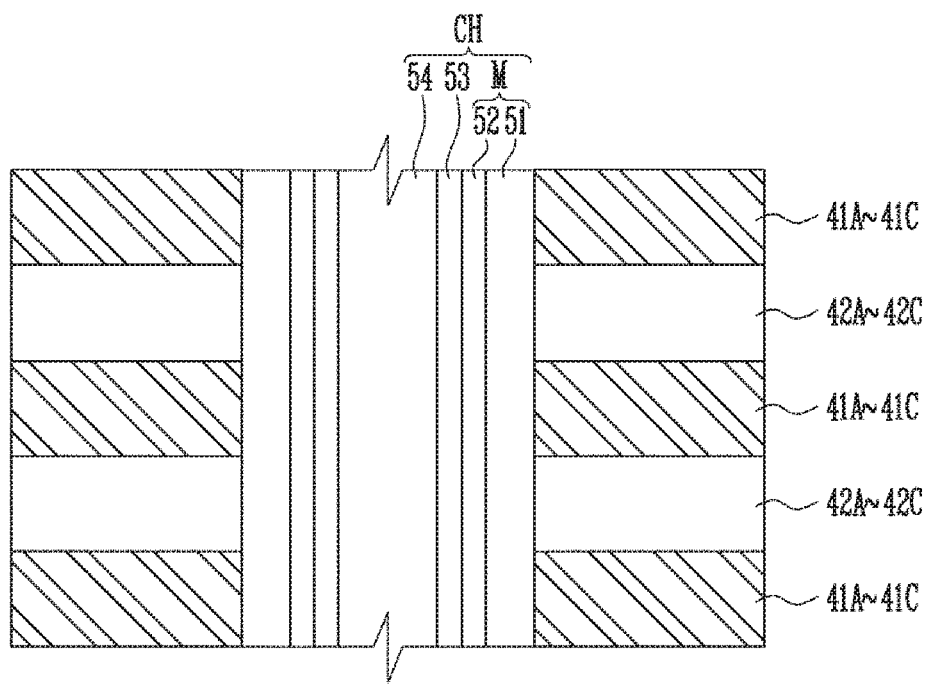

Referring to FIGS. 3A and 3B, there is formed a stack structure in which sacrificial layers 41A to 41C and insulating layers 42A to 42C are alternately stacked. Here, the sacrificial layers 41A to 41C may be formed of a material having a high etching selection ratio with respect to the insulating layers 42A to 42C. For example, the sacrificial layers 41A to 41C may be nitride layers, and the insulating layers 42A to 42C may be oxide layers.

Additionally, there is formed a channel structure CH penetrating the stack structure ST. For example, after a hole penetrating the stack structure ST is formed, a first memory layer M is formed in the hole. Subsequently, a channel layer 53 and a gap-fill insulating layer 54 are formed in the first memory layer M. Here, the first memory layer M may include at least one of a tunnel insulating layer, a data storage layer, and a charge blocking layer. The data storage layer may include silicon, a nitride, a floating gate, a charge trap material, nano dots, a phase change material, a variable resistance material, and the like. For example, the first memory layer M may include a tunnel insulating layer 52 surrounding a sidewall of the channel layer CH and a data storage layer 51 surrounding the tunnel insulating layer 52. In addition, the data storage layer 51 may have a sufficient thickness as a partial thickness of the data storage layer 51 is oxidized in a next process.

Also, there are formed a first slit insulating layer 43A, slit insulating patterns 43B, and a third slit insulating layer 43C, which penetrate the stack structure ST. Here, the first slit insulating layer 43A, the slit insulating patterns 43B, and the third slit insulating layer 43C may be simultaneously formed or be sequentially formed. Also, the first slit insulating layer 43A, the slit insulating patterns 43B, and the third slit insulating layer 43C may include an oxide.

The first slit insulating layer 43A may have a line shape extending in one direction. Each of the slit insulating patterns 43B may have an island shape, and a plurality of slit insulating patterns 43B may be arranged at a predetermined distance along the one direction. The third slit insulating layer 43C may have a line shape extending in the one direction and extend in parallel to the first slit insulating layer 43A.

For example, after first slits SL1 penetrating the stack structure ST are formed, the first slit insulating layer 43A, the slit insulating patterns 43B, and the third slit insulating layer 43C may be formed by filling an insulating layer in the first slits SL1. The first slit insulating layer 43A, the slit insulating patterns 43B, and the third slit insulating layer 43C may be formed to completely fill in the first slits SL1, or may be formed so as to include empty spaces, e.g., voids V.

The first slit insulating layer 43A, the slit insulating patterns 43B, and the third slit insulating layer 43C may be arranged such that the distance between the slit insulating patterns 43B and the third slit insulating layer 43C is wider than the distance between the first slit insulating layer 43A and the slit insulating patterns 43B. Accordingly, it is possible to ensure a space in which a second slit is to be formed between the slit insulating patterns 43B and the third slit insulating layer 43C.

In order to ensure a path having a sufficient width, through which the sacrificial layers 41A to 41C will be removed in a subsequent process, the slit insulating patterns 43B are formed such that each of the slit insulating patterns 43B has a relatively short length and adjacent slit insulating patterns 43B have a relatively wide distance by comparison.

Also formed are second slits SL2 that penetrate the stack structure ST. Here, the second slits SL2 are located between the slit insulating patterns 43B and the third slit insulating layer 43C. Thus, the slit insulating patterns 43B are located between the first slit insulating layer 43A and the second slit SL2. In addition, the sacrificial layers 41A to 41C are exposed through the second slit SL2.

Figure 4A:
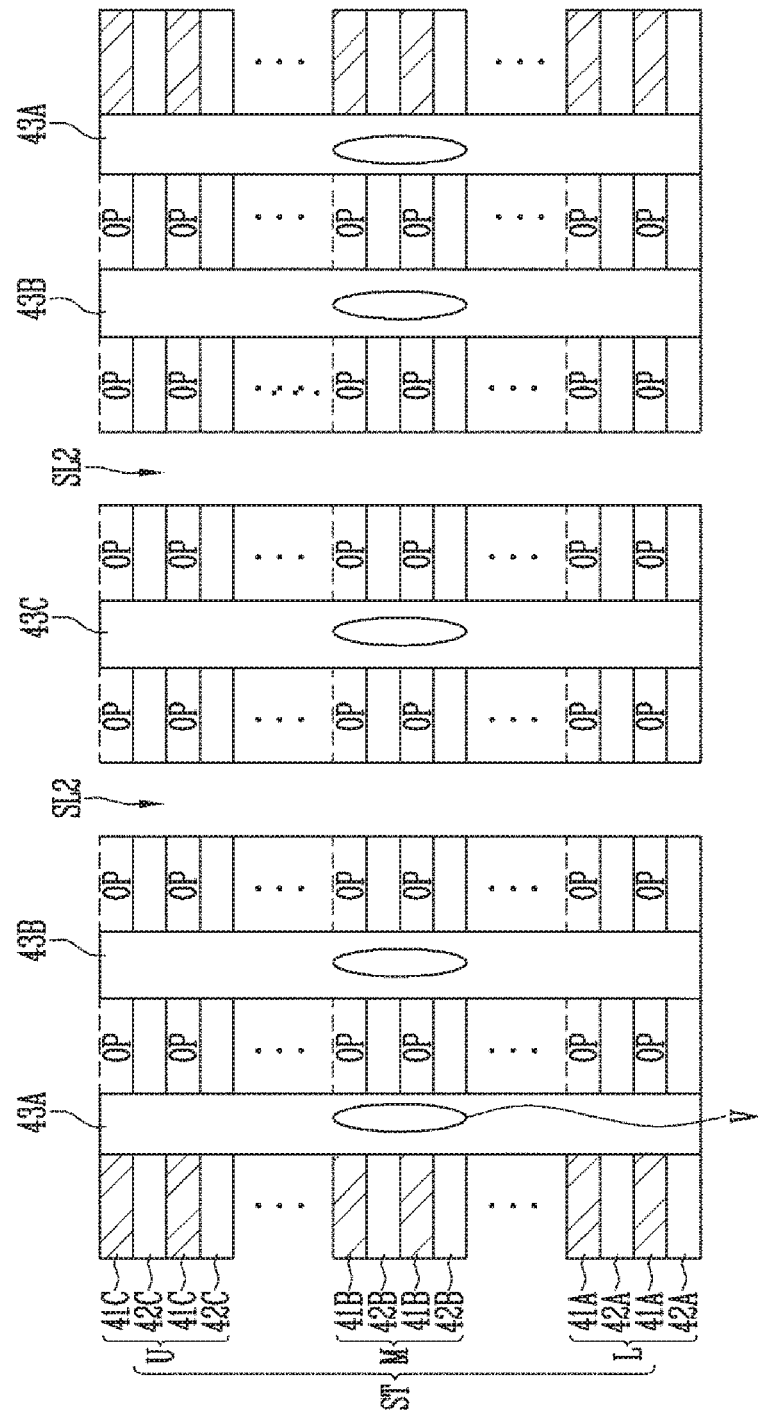
Figure 4B:
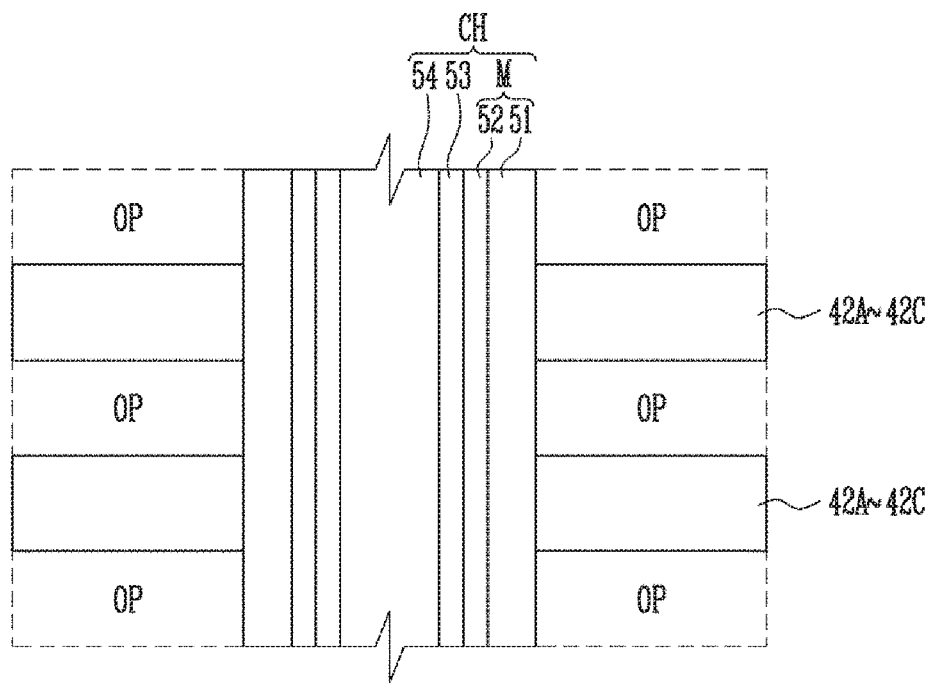

Referring to FIGS. 4A and 4B, openings OP are formed by removing the sacrificial layers 41A to 41C exposed through the second slit SL2. The openings OP are formed by removing the sacrificial layers 41A to 41C located on one side of the first slit insulating layer 43A. The sacrificial layers 41A to 41C located on the other side of the first slit insulating layer 43A are left intact. Accordingly, the first slit insulating layers 43A are exposed through the openings OP in the interconnection region IC. In addition, the channel structure CH is exposed through the openings OP in the cell array region CA. In forming the openings OP in one embodiment, sacrificial layers located between the first slit insulating layer 43A and the slit insulating patterns 43B and between the slit insulating patterns 43B and the second slit SL2 are removed.

In an example, an etchant introduced through the second slit SL2 selectively etches the sacrificial layers 41A to 41C interposed between the slit insulating patterns 433 and the second slit SL2, and selectively etches the sacrificial layers 41A to 41C interposed between the slit insulating patterns 43B. In addition, as the etchant is introduced through a space between the slit insulating patterns 43B, the sacrificial layers 41A to 41C interposed between the first slit insulating layer 43A and the slit insulating patterns 43B are selectively etched. At this time, as described with reference to FIG. 1C, the length of the slit insulating patterns 43B is decreased, and the space between the slit insulating patterns 43B is ensured, so that the sacrificial layers 41A to 41C interposed between the first slit insulating layer 43A and the slit insulating patterns 43B can be completely or sufficiently removed. Here, the term "sufficiently removed" means that the sacrificial layers 41A to 41C are removed to an extent where the shrinkage of the slit insulating patterns 43B is not influenced by any portion of the sacrificial layers 41A to 41C remaining between the first slit insulating layer 43A and the slit insulating patterns 43B.

Accordingly, all of the sacrificial layers 41A to 41C on both sides of the slit insulating patterns 43B and on both sides of the third slit insulating layer 43C are removed. On the other hand, the sacrificial layers 41A to 41C on one side of the first slit insulating layer 43A remain, and the openings OP exist at the other side of the first slit insulating layer 43A. That is, the first slit insulating layer 43A has an asymmetrical ambient environment Referring to FIGS. 5A and 5B, the first memory layer M exposed through the openings OP is oxidized to a partial thickness, thereby forming a first charge blocking layer 55. For example, the data storage layer 51 is oxidized to a partial thickness, thereby forming the first charge blocking layer 55. Accordingly, the data storage layer 51 has unevenness on an outer surface thereof In this case, in the course of performing an oxidizing process for forming the first charge blocking layer 55, the first slit insulating layer 43A, the slit insulating patterns 43B, and the third slit insulating layer 43C may be shrunk in the course of performing the oxidizing process for forming the first charge blocking layer 55. As an example, since one side of the first slit insulating layer 43A is supported by the sacrificial layers 41A to 41C remaining on the one side, portions of the first slit insulating layer 43A, which are in contact with the openings OP, may be further shrunk as compared with portions of the first slit insulating layer 43A, which are in contact with the sacrificial layers 41A to 41C. Therefore, the first slit insulating layer 43A may be asymmetrically shrunk. As another example, the first slit insulating layer 43A and the slit insulating patterns 43B may be shrunk with different shrinkage rates. Since the slit insulating patterns 43B have the openings OP on both sides thereof, the slit insulating patterns 43B may be further shrunk as compared with the first slit insulating layer 43A having the openings OP on only one side thereof. Therefore, the slit insulating patterns 4313 may have a low height as compared with the first slit insulating layer 43A. Since the third slit insulating layer 43C has the openings OP on both sides thereof, the third slit insulating layer 43C may be further shrunk as compared with the first slit insulating layer 43A. The third slit insulating layer 43C may therefore have a lower height as compared with the first slit insulating layer 43A.

As described above, when the first slit insulating layer 43A, the slit insulating patterns 43B, and the third slit insulating layer 43C are shrunk, the insulating layers 42A to 42C connected to the first slit insulating layer 43A, the slit insulating patterns 43B, and the third slit insulating layer 43C may be partially bent. In addition, the openings OP defined between the insulating layers 42A to 42C may also be partially bent. For example, the insulating layers 42A to 42C and the openings OP between the first slit insulating layer 43A and the slit insulating patterns 43B may be bent. The insulating layers 42A to 42C and the openings OP between the slit insulating patterns 43B and the second slit SL2 may maintain a flat structure. The insulating layers 42A to 42C and the openings OP between the third slit insulating layer 43C and the second slit SL2 may maintain a flat structure.

In some instances, the oxidizing process for forming the first charge blocking layer 55 may be omitted. In such case, the insulating layers 42A to 42C and the openings OP may maintain a flat structure.

Figure 6A:
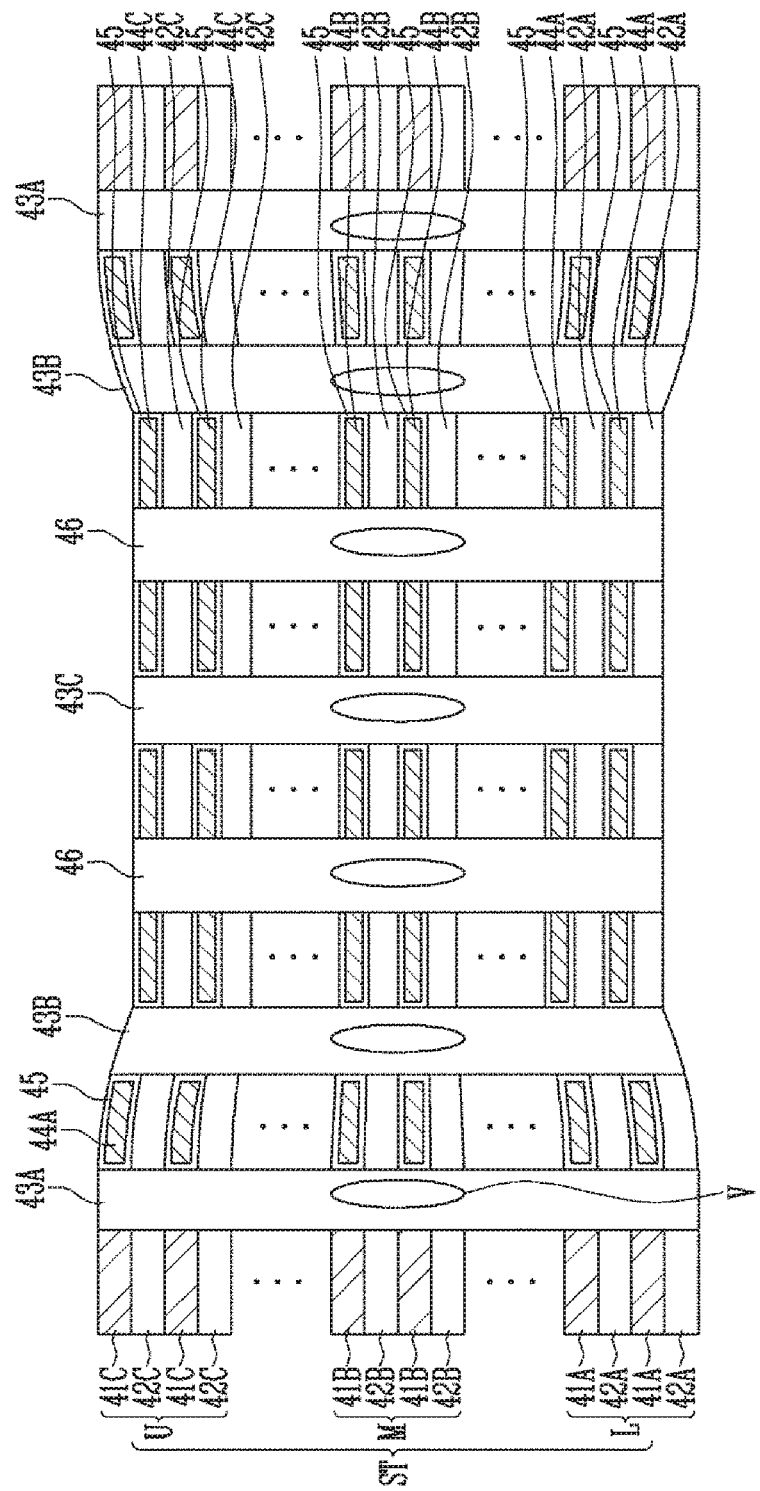
Figure 6B:
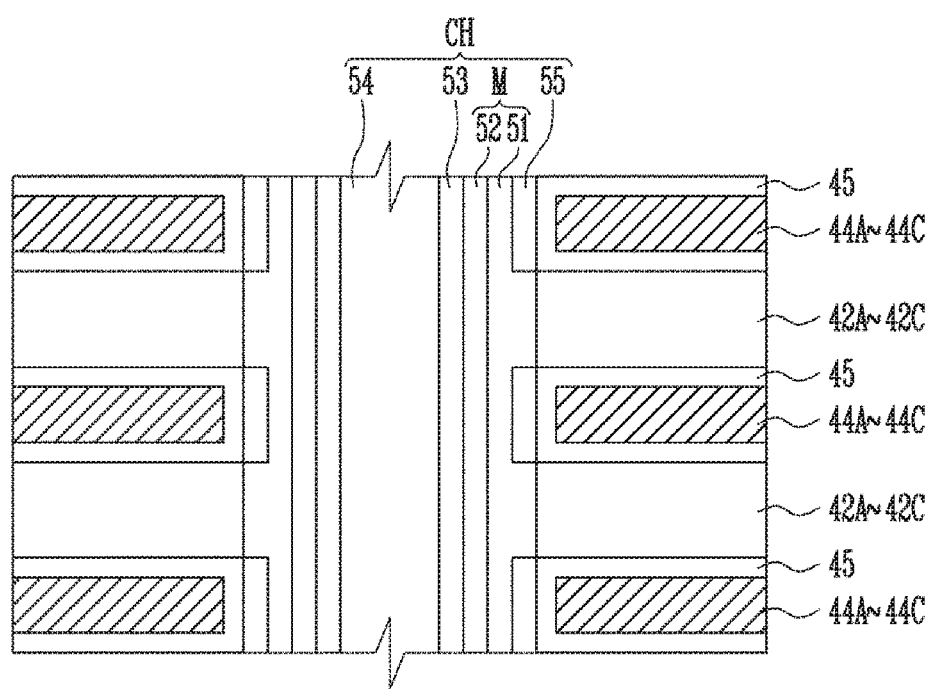

Referring briefly to an embodiment illustrated by FIGS. 6A and 6B, after conductive layers 44A to 44C are formed in the openings OP, a second slit insulating layer 46 is formed in the second slit SL2.

Referring again to FIGS. 5A and 5B, when an oxidizing process is performed, the conductive layers 44A to 44C are formed in the partially bent openings OP, and therefore, at least one conductive layer among the conductive layers 44A to 44C may also have a partially bent structure. For example, at least one lowermost conductive layer 44A among the conductive layers 44A to 44C may be bent upward between the first slit insulating layer 43A and the slit insulating patterns 43B as shown, and at least one uppermost conductive layer 44A among the conductive layers 44A to 44C may be bent downward between the first slit insulating layer 43A and the slit insulating patterns 43B as shown. The other conductive layers 44B may have a flat structure.

Figure 5A:
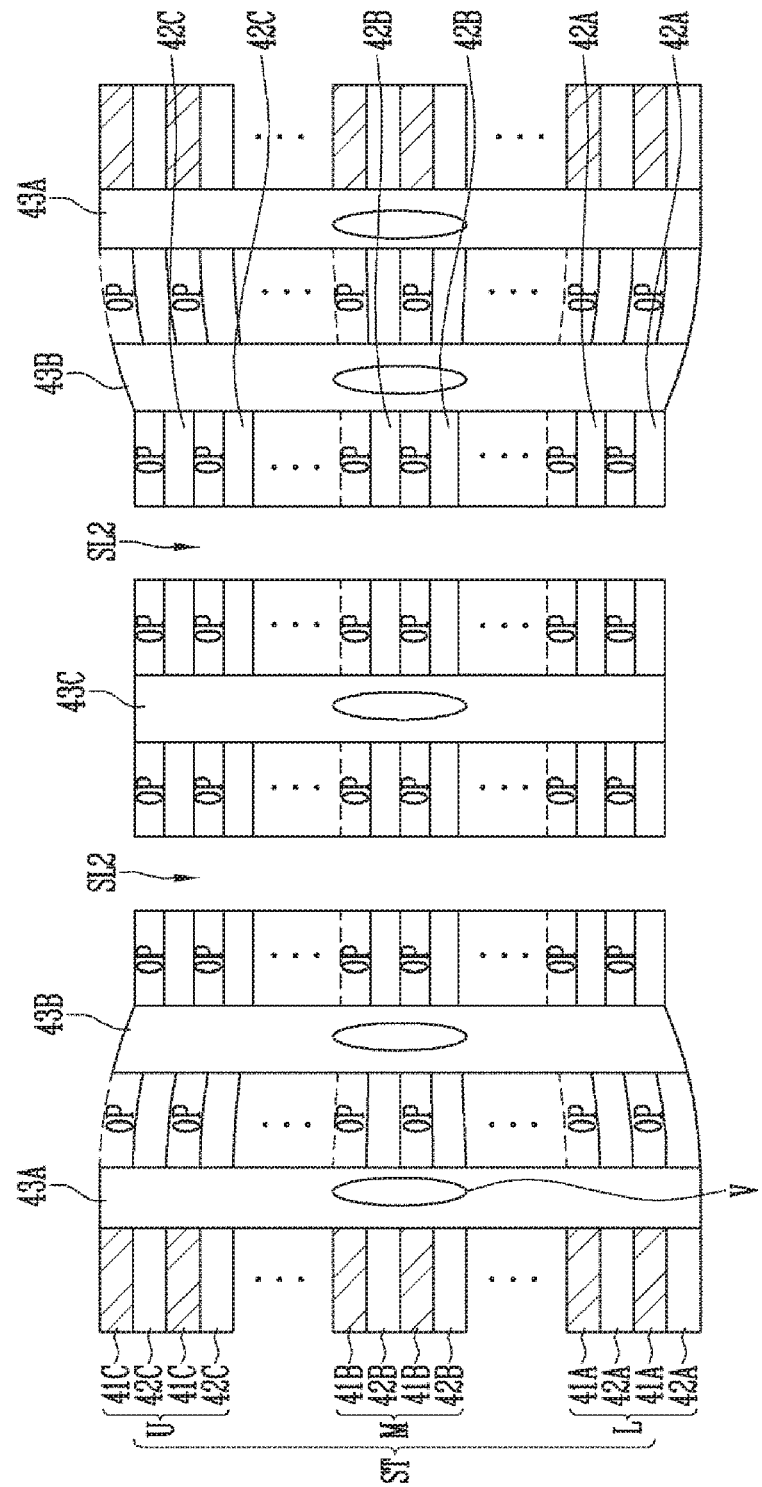
Figure 5B:
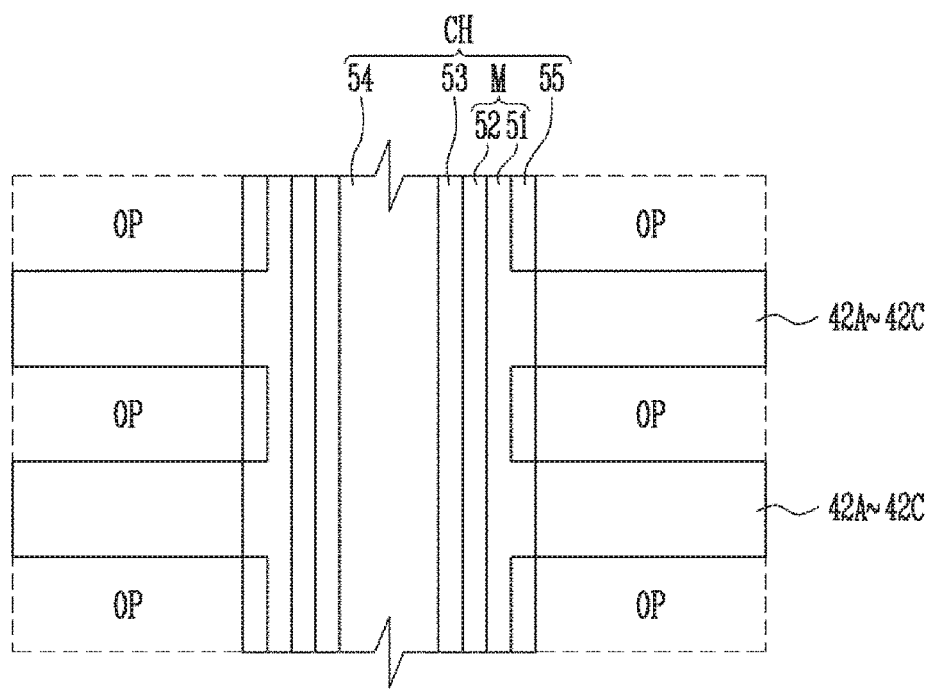

If the oxidizing process of FIGS. 5A and 5B is omitted, the insulating layers 42A to 42C and the openings OP may be bent by a high-temperature process. For example, second memory layers 45 may be additionally formed before the conductive layers 44A to 44C are formed, and the high-temperature process may be performed in this course. Here, each of the second memory layers 45 may include at least one of a tunnel insulating layer, a data storage layer, and a charge blocking layer, which may be a second charge blocking layer. For example, the second charge blocking layer includes a high dielectric constant material such as an aluminum oxide ($Al_2O_3$) layer. Therefore, in the course of additionally forming the second memory layers 45, the first slit insulating layer 43A, the slit insulating patterns 43B, and the third slit insulating layer 43C may be shrunk as described with reference to FIG. 5A. In addition, the insulating layers 42A to 42C and the openings OP may be partially bent, and at least one conductive layer 44A to 44C may be partially bent.

According to the manufacturing method described above, the length of the slit insulating patterns 43B and the distance between the slit insulating patterns 43B are adjusted so that the sacrificial layers 41A to 41C between the first slit insulating layer 43 and the slit insulating patterns 43B can be completely or sufficiently removed. Thus, although the first slit insulating layer 43A and the slit insulating patterns 43B are shrunk in the high-temperature process, and therefore, at least one conductive layer 44A to 44C is partially bent, a bending section can be defined between the first slit insulating layer 43A and the slit insulating patterns 43B. In this case, it is possible to prevent bending of a portion to which a bias is mainly transmitted among the conductive layers 44A to 44C, i.e., a region between the slit insulating patterns 43B and the second slit insulating layer 46.

Figure 7:
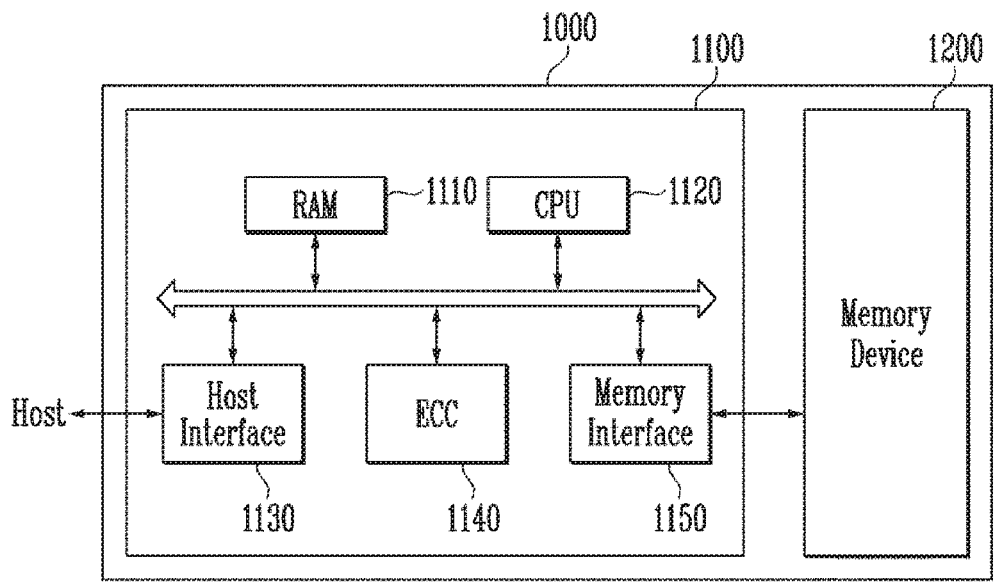
FIGS. 7 and 8 show block diagrams illustrating configurations of memory systems according to embodiments of the present disclosure.

FIG. 7 shows a block diagram illustrating a configuration of a memory system 1000 according to an embodiment of the present disclosure.

Referring to FIG. 7, the memory system 1000 includes a memory device 1200 and a controller 1100.

The memory device 1200 is used to store data information having various data formats, such as texts, graphics, and software codes. The memory device 1200 may be a non-volatile memory. Also, the memory device 1200 may have the structures described with reference to FIGS. 1A to 6B, and may be manufactured according to the manufacturing method described with reference to FIGS. 1A to 6B. In an embodiment, the memory device 1200 may include: a stack structure located on a substrate, the stack structure including a first region in which sacrificial layers and insulating layers are alternately stacked and a second region in which conductive layers and insulating layers are alternately stacked; a first slit insulating layer located at a boundary between the first region and the second region, the first slit insulating layer penetrating the stack structure and extending in one direction; and a plurality of slit insulating patterns located in the second regions, the plurality of slit insulating patterns penetrating the stack structure and arranged along the one direction, wherein at least one conductive layer among the conductive layers is bent between the first slit insulating layer and the slit insulating patterns. The structure and manufacturing method of the memory device 1200 have been described above with reference to the previous figures.

The controller 1100 is connected to a host and the memory device 1200, and is configured to access the memory device 1200 in response to a request from the host. For example, the controller 1100 is configured to control reading, writing, erasing, and background operations of the memory device 1200.

The controller 1100 is shown to include a random access memory (RAM) 1110, a central processing unit (CPU) 1120, a host interface 1130, an error correction code (ECC) circuit 1140, and a memory interface 1150. In other embodiments, or in a commercial implementation, the controller 1100 may include additional components not specifically pictured in FIG. 7.

The RAM 1110 may be used as an operation memory of the CPU 1120, a cache memory between the memory device 1200 and the host, or a buffer memory between the memory device 1200 and the host. In some embodiments, the RAM 1110 may be replaced with a static random access memory (SRAM), a read-only memory (ROM), or another form of memory.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and/or a private protocol.

The ECC circuit 1140 is configured to detect and correct errors included in data that is read from the memory device 1200, using an error correction code (ECC).

The memory interface 1150 may be configured to interface with the memory device 1200. For example, the memory interface 1150 includes a NAND interface or a NOR interface.

For some embodiments, the controller 1100 may further include a buffer memory (not shown) for temporarily storing data. Here, the buffer memory may be used to temporarily store data transferred to other devices through the host interface 1130 or data transferred from the memory device 1200 through the memory interface 1150. The controller 1100 may further include a ROM that stores code data for interfacing with the host.

As described above, the memory system 1000 according to an embodiment of the present disclosure includes the memory device 1200 having an improved degree of integration and improved characteristics. Thus, it is possible to improve the degree of integration and characteristics of the memory system 1000.

Figure 8:
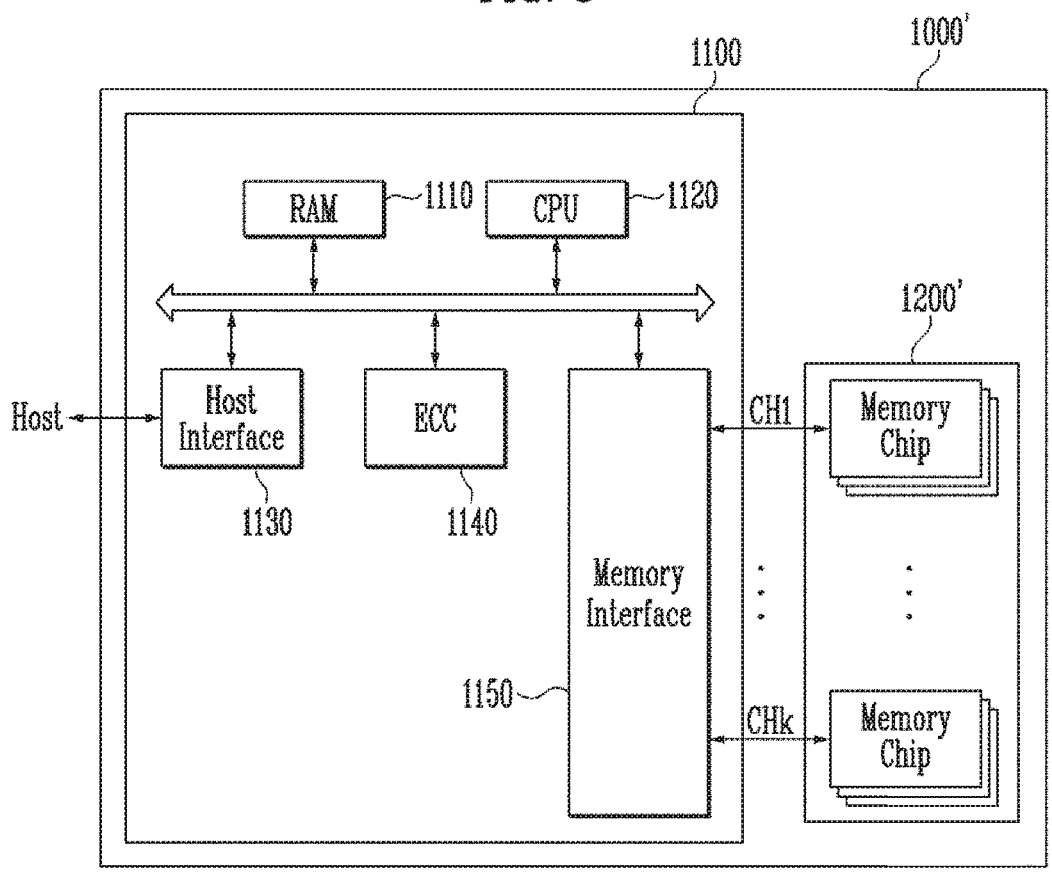

FIG. 8 shows a block diagram illustrating a configuration of a memory system 1000' according to an embodiment of the present disclosure. Hereinafter, repeated descriptions of components already described above will be omitted.

Referring to FIG. 8, the memory system 1000' according to an embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 6B, and may be manufactured according to the manufacturing method described with reference to FIGS. 1A to 6B. In an embodiment, the memory device 1200' may include a stack structure located on a substrate. The stack structure includes: a first region, in which sacrificial layers and insulating layers are alternately stacked; a second region, in which conductive layers and insulating layers are alternately stacked; a first slit insulating layer located at a boundary between the first region and the second region, the first slit insulating layer penetrating the stack structure and extending in one direction; and a plurality of slit insulating patterns located in the second regions, the plurality of slit insulating patterns penetrating the stack structure and arranged along the one direction, wherein at least one conductive layer among the conductive layers is bent between the first slit insulating layer and the slit insulating patterns. For various embodiments, the structure and manufacturing method of the memory device 1200' are the same as described above, therefore, their detailed descriptions will be omitted here.

The memory device 1200' may be a multi-chip package including a plurality of memory chips. The plurality of memory chips may be divided into a plurality of groups, which are configured to communicate with the controller 1100 over first to kth channels (CH1 to CHk). In addition, memory chips included in one group may be configured to communicate with the controller 1100 over a common channel. For an embodiment, the memory system 1000' may be modified such that one memory chip is connected to one channel.

As described above, the memory system 1000' according to embodiments of the present disclosure includes the memory device 1200' having an improved degree of integration and improved characteristics. Thus, it is possible to improve the degree of integration and characteristics of the memory system 1000'. Particularly, the memory device 1200' is configured as a multi-chip package, so that it is possible to increase the data storage capacity of the memory system 1000' and to improve the operation speed of the memory system 1000'.

Figure 9:
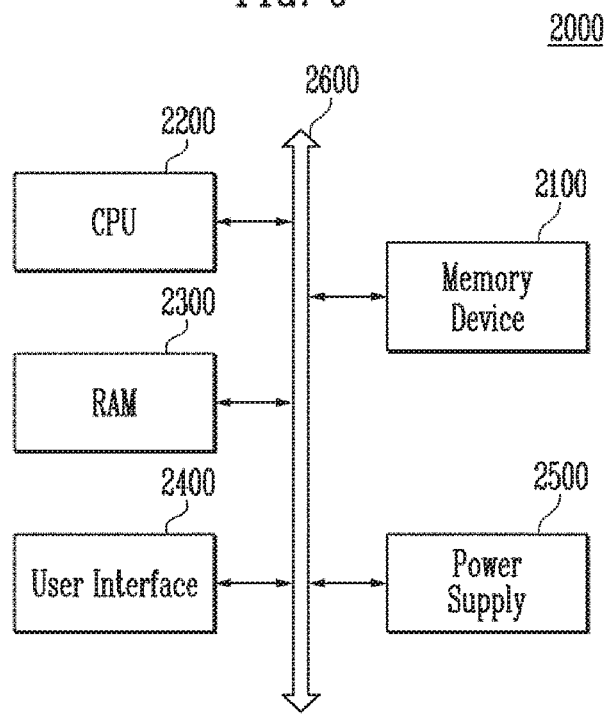
FIGS. 9 and 10 show block diagrams illustrating configurations of computing systems according to embodiments of the present disclosure.

FIG. 9 shows a block diagram illustrating a configuration of a computing system 2000 according to an embodiment of the present disclosure. Hereinafter, repeated description of components already described above will be omitted.

Referring to FIG. 9, the computing system 2000 is shown to include a memory device 2100, a CPU 2200, a RAM 2300, a user interface 2400, a power source 2500, and a system bus 2600. In other embodiments, or in a commercial implementation, the computing system 2000 may include additional components not specifically pictured in FIG, 9.

The memory device 2100 stores data provided through the user interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to the system bus 2600 through a controller (not shown) or directly connected. When the memory device 2100 is directly connected to the system bus 2600, a function of the controller may be performed by the CPU 2200, the RAM 2300, etc.

Here, the memory device 2100 may be a nonvolatile memory. Also, the memory device 2100 may have the structures described with reference to FIGS. 1A to 6B, and may be manufactured according to the manufacturing method described with reference to FIGS. 1A to 6B. In an embodiment, the memory device 2100 may include: a stack structure located on a substrate, the stack structure including a first region in which sacrificial layers and insulating layers are alternately stacked and a second region in which conductive layers and insulating layers are alternately stacked; a first slit insulating layer located at a boundary between the first region and the second region, the first slit insulating layer penetrating the stack structure and extending in one direction; and a plurality of slit insulating patterns located in the second regions, the plurality of slit insulating patterns penetrating the stack structure and arranged along the one direction, wherein at least one conductive layer among the conductive layers is bent between the first slit insulating layer and the slit insulating patterns. The structure and manufacturing method of the memory device 2100 are the same as described above, and therefore, their detailed descriptions will not be repeated here.

The memory device 2100 may be a multi-chip package including a plurality of memory chips as described above with reference to FIG. 8.

The computing system 2000 is configured, as described above, as a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, or any electronic device including a CPU and memory.

As described above, the computing system 2000 according to an embodiment of the present disclosure includes the memory device 2100 having an improved degree of integration and improved characteristics. Thus, it is possible to improve the degree of integration and characteristics of the computing system 2000.

Figure 10:
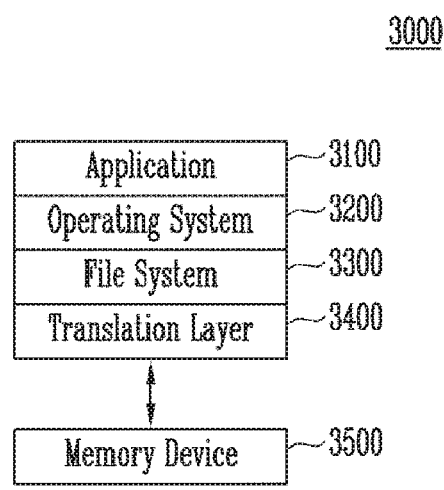

FIG. 10 shows a block diagram illustrating a computing system 3000 according to an embodiment of the present disclosure.

Referring to FIG. 10, the computing system 3000 includes a software layer having an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and it organizes the data or files stored in the memory device 3500 according to a rule. The file system 3300 may be determined depending on the operating system 3200 used in the computing system 3000. For example, when the operating system 3200 is a Windows operating systems from Microsoft, the file system 3300 may be a file allocation table (FAT) or a new technology file system (NTFS). When the operating system 3200 is a Unix/Linux operating system, the file system 3300 may be an extended file system (EXT), a Unix file system (UFS), or a journaling file system (JFS).

As shown, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. Also, the memory device 3500 may have the structures described with reference to FIGS. 1A to 6B, and may be manufactured according to the manufacturing method described with reference to FIGS. 1A to 6B. In an embodiment, the memory device 3500 may include: a stack structure located on a substrate, the stack structure including a first region in which sacrificial layers and insulating layers are alternately stacked and a second region in which conductive layers and insulating layers are alternately stacked; a first slit insulating layer located at a boundary between the first region and the second region, the first slit insulating layer penetrating the stack structure and extending in one direction; and a plurality of slit insulating patterns located in the second regions, the plurality of slit insulating patterns penetrating the stack structure and arranged along the one direction, wherein at least one conductive layer among the conductive layers is bent between the first slit insulating layer and the slit insulating patterns. The structure and manufacturing method of the memory device 3500 have already been described above. Therefore, their detailed descriptions are omitted here.

The computing system 3000 configured as described above may be divided into an operating system layer performed in an upper-level region and a controller layer performed in a lower-level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to the embodiment of the present disclosure includes the memory device 3500 having an improved degree of integration and improved characteristics. Thus, it is possible to improve the degree of integration and characteristics of the computing system 3000.

According to the present disclosure, it is possible to provide a semiconductor device having a stable structure and improved reliability. Also, in manufacturing of the semiconductor device, the level of difficulty of processes can be lowered, thereby simplifying the manufacturing procedure and reducing the manufacturing.

Example embodiments have been disclosed herein. Although specific terms are employed, they are used and are to be interpreted in a generic and descriptive sense only and not for the purpose of limitation. In some instances, as would be apparent to one of ordinary skill in the art as of the time of filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made without departing from the spirit and scope of the present disclosure as set forth by the following claims.

What is claimed is:

1. A method of manufacturing a semiconductor device, the method comprising:
   forming a stack structure that includes sacrificial layers and insulating layers, which are alternately stacked on a substrate;
   forming a first slit insulating layer penetrating the stack structure and extending in one direction;
   forming a plurality of slit insulating patterns penetrating the stack structure and arranged along the one direction;

forming a second slit penetrating the stack structure and extending in the one direction, wherein the slit insulating patterns are located between the first slit insulating layer and the second slit; and replacing the sacrificial layers located between the first slit insulating layer and the slit insulating patterns and between the slit insulating patterns and the second slit with conductive layers through the second slit, wherein at least one conductive layer among the conductive layers is bent between the first slit insulating layer and the slit insulating patterns.

2. The method of claim 1, wherein a first conductive layer among the conductive layers is bent upward between the first slit insulating layer and the slit insulating patterns, and a second conductive layer among the conductive layers is located at a level higher than that of the first conductive layer and is bent downward between the first slit insulating layer and the slit insulating patterns.

3. The method of claim 1, wherein the at least one conductive layer is parallel to the substrate between the second slit and the slit insulating patterns, and the at least one conductive layer is bent at a predetermined angle with respect to the substrate between the first slit insulating layer and the slit insulating patterns.

4. The method of claim 1, wherein the first slit insulating layer and the slit insulating patterns are shrunk by a heat treatment process, and the first slit insulating layer and the slit insulating patterns have different shrinkage rates.

5. The method of claim 1, wherein the at least one conductive layer is partially bent as the first slit insulating layer is asymmetrically shrunk.

6. The method of claim 1, wherein the at least one conductive layer is partially bent due to a difference in shrinkage rate between the first slit insulating layer and the slit insulating patterns.

7. The method of claim 1, wherein a distance between adjacent slit insulating patterns in the one direction is equal to or larger than a length of each of the slit insulating patterns.

8. The method of claim 1, wherein the first slit insulating layer has a cross section of a closed curve shape, and the first region is located in the first slit insulating layer having the closed curve shape.

9. The method of claim 1 further comprising:
before the stack structure is formed, forming a line on the substrate; and
forming an interconnector that penetrates the sacrificial layers and the insulating layers, which remain in the stack structure, and is connected to the line.

10. A method of manufacturing a semiconductor device, the method comprising:
forming a stack structure that includes sacrificial layers and insulating layers, which are alternately stacked;
forming a first slit insulating layer penetrating the stack structure and extending in one direction;
forming a plurality of slit insulating patterns penetrating the stack structure and arranged along the one direction;
forming a second slit penetrating the stack structure and extending in the one direction, wherein the slit insulating patterns are located between the first slit insulating layer and the second slit;

forming openings by removing the sacrificial layers through the second slit such that sacrificial layers located on one side of the first slit insulating layer remain and sacrificial layers located on the other side of the first slit insulating layer are removed;
performing a heat treatment process, wherein the first slit insulating layer and the slit insulating patterns are shrunk to different heights; and
forming conductive layers in the openings.

11. The method of claim 10, wherein the at least one conductive layer is partially bent between the first slit insulating layer and the slit insulating patterns due to a difference in shrinkage rate between the first slit insulating layer and the slit insulating patterns.

12. The method of claim 10, wherein the at least one conductive layer is partially bent between the first slit insulating layer and the slit insulating patterns as the first slit insulating layer is asymmetrically shrunk.

13. The method of claim 10, wherein, in the forming of the openings, sacrificial layers located between the first slit insulating layer and the slit insulating patterns and between the slit insulating patterns and the second slit are removed.

14. The method of claim 10 further comprising, before the conductive layers are formed, forming a memory layer in the openings,
wherein the forming of the memory layer includes the heat treatment process.

15. The method of claim 10 further comprising:
forming a hole that penetrates the stack structure;
forming a memory layer in the hole; and
oxidizing the memory layer exposed through the opening to a partial thickness,
wherein the oxidizing of the memory layer includes the heat treatment process.

16. The method of claim 10, wherein at least one conductive layer among the conductive layers is flat between the second slit and the slit insulating patterns, and is bent between the first slit insulating layer and the slit insulating patterns.

17. The method of claim 10, wherein a first conductive layer among the conductive layers is bent upward between the first slit insulating layer and the slit insulating patterns, and a second conductive layer among the conductive layers is located at a level higher than that of the first conductive layer and is bent downward between the first slit insulating layer and the slit insulating patterns.

18. The method of claim 10, wherein a distance between adjacent slit insulating patterns in the one direction is equal to or larger than a length of each of the slit insulating patterns.

19. The method of claim 10, wherein the first slit insulating layer has a cross section of a closed curve shape, and the first region is located in the first slit insulating layer having the closed curve shape.

20. The method of claim 10 further comprising:
forming a line before the stack structure is formed over the line; and
forming an interconnector that penetrates the sacrificial layers and the insulating layers, which remain in the stack structure, wherein the interconnector is connected to the line.

* * * * *